(12) United States Patent
Park et al.

(10) Patent No.: US 10,932,369 B2
(45) Date of Patent: Feb. 23, 2021

(54) DISPLAY DEVICE

(71) Applicant: Samsung Display Co., Ltd., Yongin-si (KR)

(72) Inventors: Soon-sung Park, Asan-si (KR); Jeongjin Kim, Cheonan-si (KR); Seung-woo Kang, Seongnam-si (KR); Jeongbong Lee, Hwaseong-si (KR); Younghoon Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/549,693

(22) Filed: Aug. 23, 2019

(65) Prior Publication Data

US 2020/0120807 A1 Apr. 16, 2020

(30) Foreign Application Priority Data

Oct. 15, 2018 (KR) .......................... 10-2018-0122574

(51) Int. Cl.
*G06F 3/044* (2006.01)
*H05K 1/18* (2006.01)
*G06F 3/046* (2006.01)

(52) U.S. Cl.
CPC ............ *H05K 1/189* (2013.01); *G06F 3/046* (2013.01); *G06F 3/0446* (2019.05); *G06F 2203/04105* (2013.01); *H05K 2201/10151* (2013.01)

(58) Field of Classification Search
CPC . G06F 2203/04103; G06F 2203/04105; G06F 3/0412; G06F 3/04164; G06F 3/0443; G06F 3/0446; G06F 3/046; H05K 1/189; H05K 2201/10151
USPC .............................................................. 1/1
See application file for complete search history.

(56) References Cited

U.S. PATENT DOCUMENTS

| 10,177,129 B2 * | 1/2019 | Namkung | ............... H01L 25/18 |
| 2016/0259469 A1 * | 9/2016 | Kim | .................... G06F 1/1637 |
| 2017/0352834 A1 * | 12/2017 | Kim | ................... H01L 27/3276 |
| 2019/0019855 A1 * | 1/2019 | Park | .................... H01L 51/5246 |

FOREIGN PATENT DOCUMENTS

| KR | 10-2016-0106829 | 9/2016 |
| KR | 10-2017-0137984 | 12/2017 |
| KR | 10-2018-0003716 | 1/2018 |

* cited by examiner

*Primary Examiner* — Tony O Davis

(74) *Attorney, Agent, or Firm* — H.C. Park & Associates, PLC

(57) ABSTRACT

A display device may include a window, an input sensing panel, first to third connection circuit boards, an optical sheet, a display panel, a stress control film, and a first adhesive member configured to couple the optical sheet and the input sensing panel. On a plane, the first adhesive member may include an inner portion overlapping the optical sheet and an outer portion extending from the inner portion to the outside and non-overlapping the optical sheet while overlapping the stress control film. A first portion of an edge of the first adhesive member defines a recessed area that is recessed toward a center area of the inner portion so that a partial area of the optical sheet is exposed.

20 Claims, 17 Drawing Sheets

[Shear Stress Distribution]

DISPLAY DEVICE

CROSS-REFERENCE TO RELATED APPLICATION

This application claims priority from and the benefit of Korean Patent Application No. 10-2018-0122574, filed on Oct. 15, 2018, which is hereby incorporated by reference for all purposes as if fully set forth herein.

BACKGROUND

Field

Exemplary embodiments of the invention relate generally to a display device, and more specifically, to a display device in which a defect is reduced.

Discussion of the Background

Electronic devices, such as smart phones, tablets, notebook computers, and smart televisions, have been developed. Each of the above-described electronic devices includes a display device for providing information. Each of the electronic devices further includes various electronic modules in addition to the display device.

The electronic device is manufactured by assembling the display device and the electronic modules. Here, the electronic modules are organically arranged by using a bracket and an external case of the electronic device.

The electronic device may include a display device having a bent portion to provide a slim bezel. A defect may occur in a process of bending this portion of the display device.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device having a reduced rate of a defect generated around a bending area.

Additional features of the inventive concepts will be set forth in the description which follows, and in part will be apparent from the description, or may be learned by practice of the inventive concepts.

An exemplary embodiment of the inventive concepts provides a display device including: a window; an input sensing panel disposed on a bottom surface of the window; a first connection circuit board connected to a top surface of the input sensing panel; a second connection circuit board connected to a bottom surface of the input sensing panel; an optical sheet disposed below the input sensing panel; a display panel disposed below the optical sheet, the display panel including a first non-bending area overlapping the optical sheet, a bending area that is bent from the first non-bending area, and a second non-bending area that extends from the bending area and faces the first non-bending area; a stress control film coupled to a top surface of the display panel, the stress control film overlapping the bending area, a partial area of the first non-bending area extending from the bending area, and a partial area of the second non-bending area extending from the bending area; and a first adhesive member bonding the optical sheet to the input sensing panel. Here, In an exemplary embodiment, on a plane, the first adhesive member may include: an inner portion overlapping the optical sheet; and an outer portion extending from the inner portion toward an outside to non-overlap the optical sheet, and overlapping the stress control film. The first portion of an edge of the first adhesive member may define a recessed area, which is recessed toward a center area of the inner portion, so that a partial area of the optical sheet is exposed.

In an exemplary embodiment, the second connection circuit board may overlap the recessed area.

In an exemplary embodiment, the first connection circuit board may overlap the outer portion.

In an exemplary embodiment, the outer portion may include a first area and a second area, which have different surface areas from each other, and the first connection circuit board may overlap the second area and non-overlaps the first area, and the second area has a surface area greater than that of the first area.

In an exemplary embodiment, a second portion of the edge of the first adhesive member may correspond to the outer portion, the outer portion may include a first area, in which a distance from the inner portion to the second portion of the edge of the first adhesive member is a first distance, and a second area, in which a distance from the inner portion to the second portion of the edge of the first adhesive member is a second distance that is greater than the first distance, and the second connection circuit board may overlap the second area.

In an exemplary embodiment, the display device may further include a third connection circuit board connected to the top surface of the input sensing panel, and the second connection circuit board may be disposed between the first connection circuit board and the third connection circuit board on the plane.

In an exemplary embodiment, the outer portion may include a first outer portion corresponding to the first connection circuit board and a second outer portion corresponding to the third connection circuit board.

In an exemplary embodiment, the input sensing panel may include: a base layer; first electrodes disposed on a top surface of the base layer; first signal lines disposed on the top surface of the base layer and connected to one group of the first electrodes; second signal lines disposed on the top surface of the base layer and connected to another group of the first electrodes; second electrodes disposed on a bottom surface of the base layer and crossing the first electrodes; and third signal lines disposed on the bottom surface of the base layer and connected to the second electrodes.

In an exemplary embodiment, the first connection circuit board may be electrically connected to the first signal lines, the second connection circuit board may be electrically connected to the third signal lines, and the third connection circuit board may be electrically connected to the second signal lines.

In an exemplary embodiment, the display device may further include a second adhesive member bonding the window to the input sensing panel, and the second adhesive member may overlap each of the first connection circuit board and the third connection circuit board on the plane.

In an exemplary embodiment, the display device may further include: a first protection film disposed on a bottom surface of the display panel and overlapping the first non-bending area; and a second protection film disposed on the bottom surface of the display panel and spaced apart from the first protection film and overlapping the second non-bending area.

In an exemplary embodiment, the display device may further include: a metal plate disposed on a bottom surface of the first protection film; and a second adhesive member bonding the metal plate to the second protection film.

In an exemplary embodiment, the display device may further include: a pressure detecting sensor disposed on a bottom of the first protection film; and a second adhesive member bonding the pressure detecting sensor to the second protection film.

In an exemplary embodiment, the display panel may include: a base layer disposed in correspondence to the first non-bending area, the bending area, and the second non-bending area; a circuit layer disposed on a top surface of the base layer and corresponding to the first non-bending area, the bending area, and the second non-bending area; a display element layer disposed on a top surface of the circuit layer and overlapping the first non-bending area; and an encapsulation layer disposed on the display element layer.

In an exemplary embodiment, the optical sheet may include at least one of a polarizer and a retarder.

In an exemplary embodiment, the second non-bending area may have a width less than that of the first non-bending area in a direction parallel to a bending axis.

In an exemplary embodiment, the display device may further include: a first circuit board connected to the second non-bending area; and a second circuit board connected to the first circuit board.

In an exemplary embodiment, the first connection circuit board and the second connection circuit board may be connected to the second circuit board.

In an exemplary embodiment of the inventive concepts, a display device includes: a window; an input sensing panel disposed on a bottom surface of the window; a first connection circuit board connected to a top surface of the input sensing panel; a second connection circuit board connected to a bottom surface of the input sensing panel; an optical sheet disposed below the input sensing panel; a display panel disposed below the optical sheet, the display panel including a first non-bending area overlapping the optical sheet, a bending area that is bent from the first non-bending area, and a second non-bending area that extends from the bending area and faces the first non-bending area; a stress control film including an edge facing an edge of the optical sheet, the stress control film overlapping at least the bending area and coupled to a top surface of the display panel; and an adhesive member bonding couple the optical sheet to the input sensing panel.

In an exemplary embodiment, on a plane, the adhesive member may include: an inner portion overlapping the optical sheet; and an outer portion extending from the inner portion toward an outside of the edge of the optical sheet and overlapping the stress control film. Here, a portion of an edge of the adhesive member may define a recessed area, which is recessed toward a center area of the inner portion, so that a partial area of the optical sheet is exposed.

In an exemplary embodiment, the first connection circuit board may overlap the outer portion, and the second connection circuit board may overlap the recessed area.

In an exemplary embodiment of the inventive concept, a display device includes: a window; an input sensing panel disposed on a bottom surface of the window; an optical sheet disposed below the input sensing panel; a display panel disposed below the optical sheet, the display panel including a first area overlapping the optical sheet, a second area that is bent from the first area, and a third area that extends from the second area and faces the first area; a stress control film including an edge facing an edge of the optical sheet, the stress control film overlapping at least the second area and coupled to a top surface of the display panel; and an adhesive member configured to couple the optical sheet and the input sensing panel, the adhesive member overlapping the protection film.

In an exemplary embodiment, on a plane, the adhesive member may include: an inner portion contacting the optical sheet; and an outer portion extending from the inner portion to the outside of the edge of the optical sheet and attached to the stress control film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
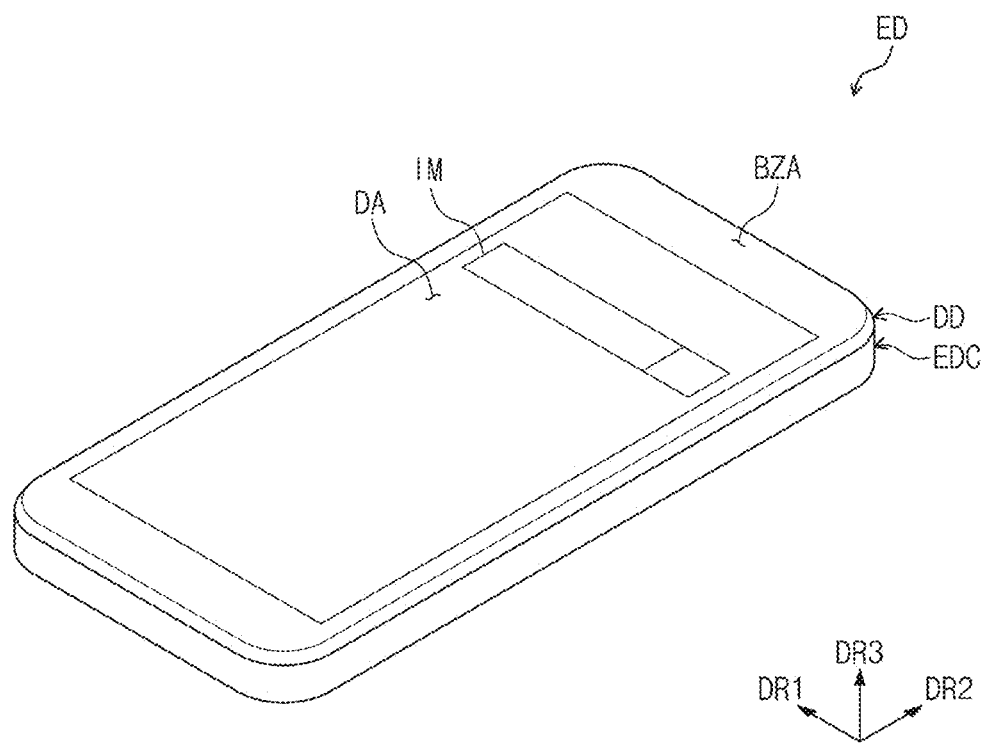
FIG. 1A is a perspective view illustrating an electronic device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
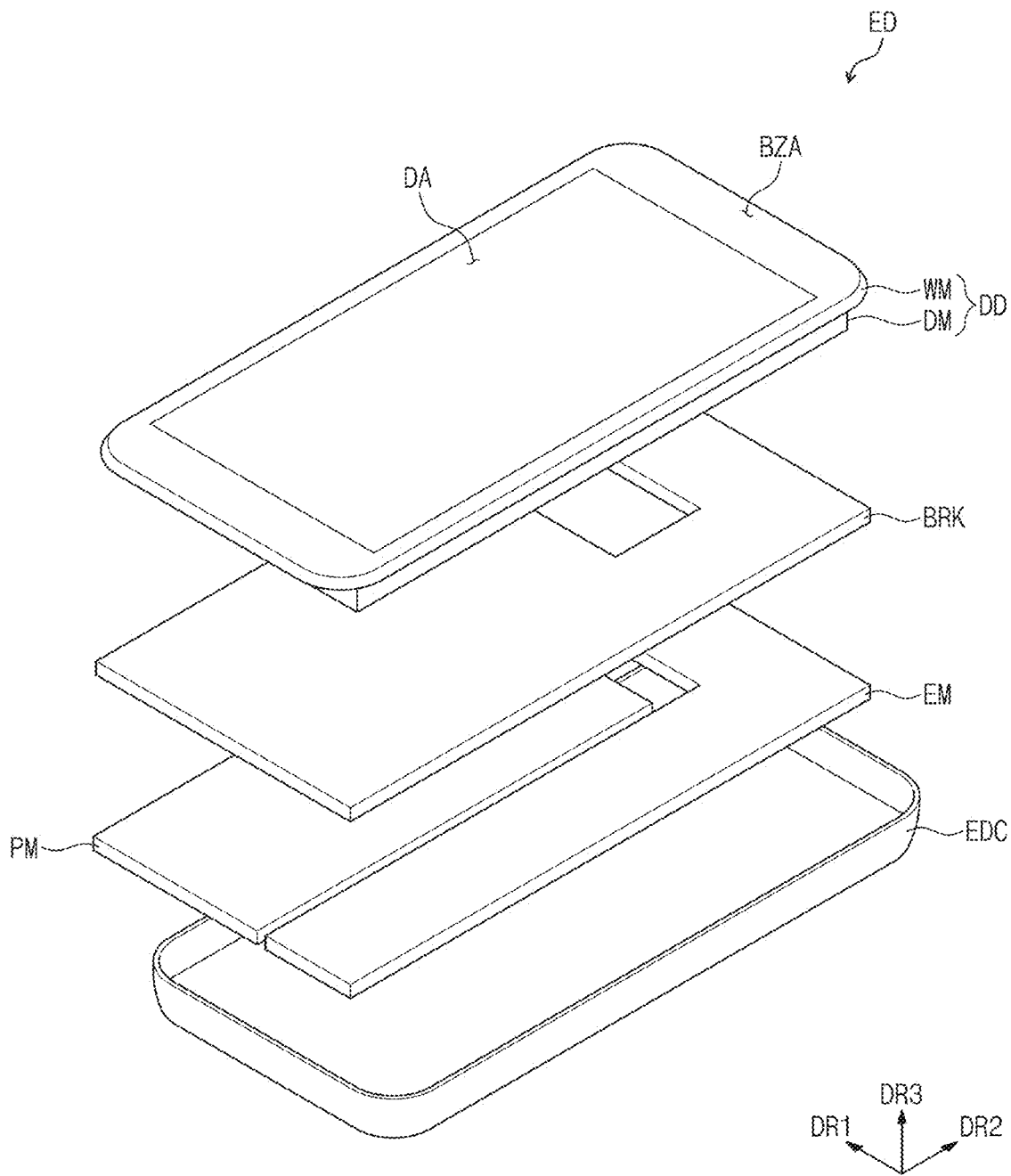
FIG. 1B is an exploded perspective view illustrating the electronic device according to an exemplary embodiment of the inventive concepts.
Figure 2:
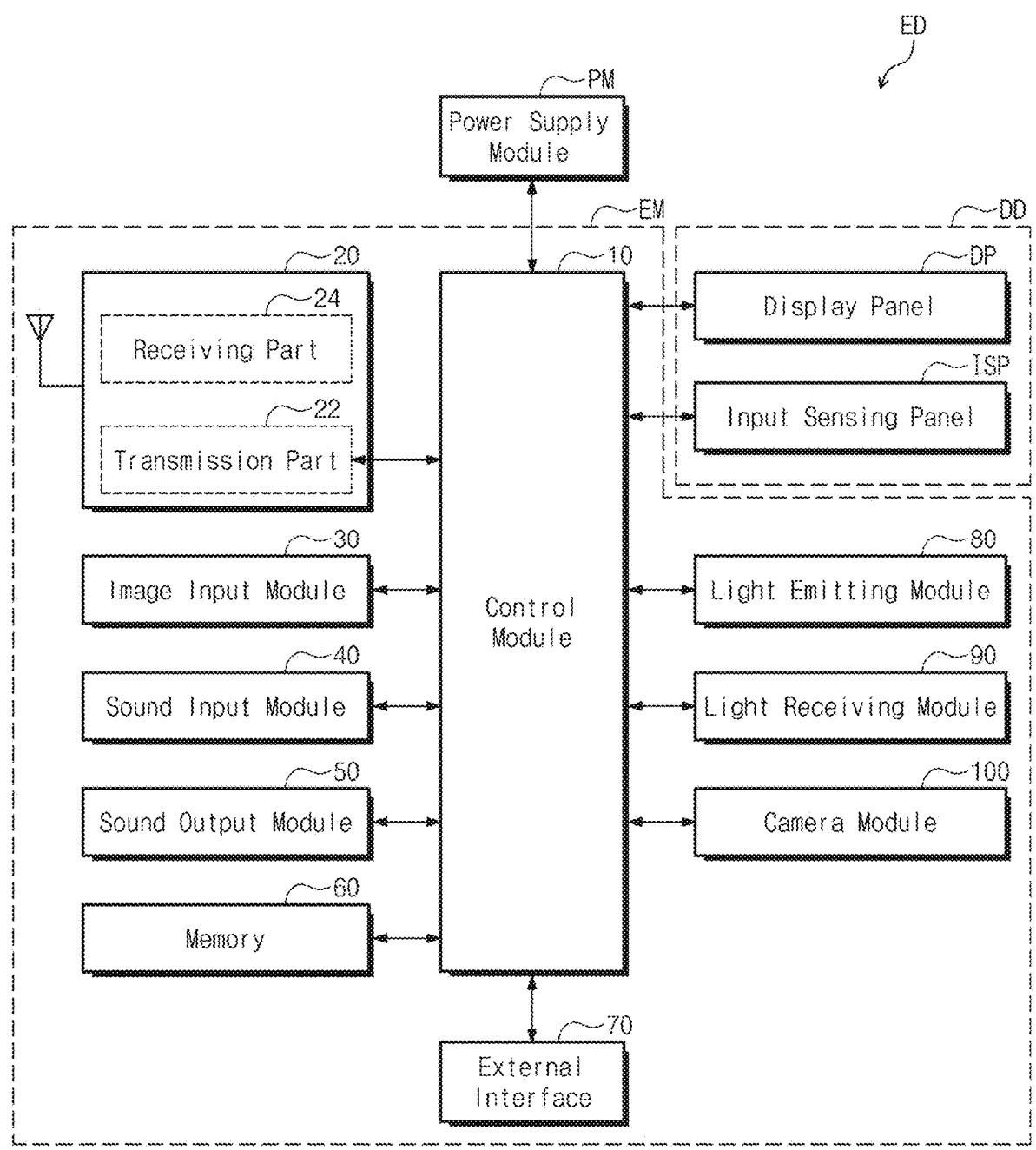
FIG. 2 is a block diagram illustrating the electronic device according to an exemplary embodiment of the inventive concepts.

FIG. 1A is a perspective view illustrating an electronic device ED according to an exemplary embodiment of the inventive concepts. FIG. 1B is an exploded perspective view illustrating the electronic device ED according to an exemplary embodiment of the inventive concepts. FIG. 2 is a block diagram illustrating the electronic device ED according to an exemplary embodiment of the inventive concepts.

In the exemplary embodiment, although a smartphone is illustrated as an example of the electronic device ED, the embodiment of the inventive concept is not limited thereto. In an exemplary embodiment of the inventive concepts, the electronic device ED may include a tablet, a notebook computer, or a smart television.

As illustrated in FIG. 1A, a display surface on which an image IM is displayed is parallel to a plane defined by a first directional axis DR1 and a second directional axis DR2. The display surface includes a display area DA and a bezel area BZA disposed adjacent to the display area DA. FIG. 1A illustrates an internet search window as an example of the image IM. For example, the display area DA may have a rectangular shape. The bezel area BZA may surround the display area DA. In other words, the bezel area BZA provides an edge of the display surface. in an exemplary embodiment of the inventive concepts, the bezel area BZA may be disposed on only two areas, which face each other in the first directional axis DR1, or disposed on only two areas, which face each other in the second directional axis DR2.

A normal direction of the display surface, i.e., a thickness direction of the electronic device DD, is indicated by a third directional axis DR3. On the basis of a direction of displaying the image IM, a front surface (or top surface or first surface) and a rear surface (or bottom surface or second surface) of each of members are defined. However, directions indicated by the first to third directional axes DR1, DR2, and DR3 may be a relative concept, and converted with respect to each other. Hereinafter, the first to third directions may be directions indicated by the first to third directional axes DR1, DR2, and DR3, and designated by the same reference numerals, respectively.

As illustrated in FIGS. 1A and 1B, the electronic device ED includes a display device DD, an electronic module EM, a power supply module PM, a bracket BRK, and an external case EDC. In FIGS. 1A and 1B, the above components are simply illustrated.

The display device DD includes a window WM and a display module DM. The window WM provides a front surface of the electronic device ED. The display module DM is disposed on a bottom surface of the window WM to generate an image. Also, the display module DM may detect a an input of a user (e.g., touch and/or pressure application of the user). The display module DM may be electrically connected to the electronic module EM through a flexible circuit board, an electric component connector, or the like.

In the exemplary embodiment, although the display module DM providing a flat display surface is exemplarily illustrated, a shape of the display module may be changed. Edges of the display module DM, which face each other in the first direction DR1, may be bent from central portions thereof to provide curved surfaces.

The power supply module PM provides power that is necessary to overall operations of the electronic device ED. The power module PM may include a conventional battery module.

The bracket BRK is coupled to the display device DD and/or the external case EDC and divides an inner space of the electronic device ED. The bracket BRK provides a space in which other components are disposed. Also, the bracket BRK may support the display device DD so that the display device DD is fixed without being shaken. A coupling groove corresponding to a shape of the electronic module EM may be defined in the bracket BRK so that the electronic module EM is fixed. The bracket BRK includes a metal or plastic member. Although one bracket BRK is exemplarily illustrated, the electronic device ED may include a plurality of brackets BRK.

The external case EDC may be coupled to the bracket BRK and/or the display device DD. The window member WM provides an outer surface of the electronic device ED. Although the external case EDC having one body is exemplarily illustrated, the external case EDC may include a plurality of bodies, which are assembled with each other. For example, the external case EDC may include a plurality of frames and/or plates, which are/is made of glass, plastic, and metal.

The electronic module EM includes a motherboard and various functional modules mounted on the motherboard to operate the electronic device ED. The motherboard may be electrically connected to the display device DD through a conventional electronic component connector or the like. Here, the motherboard may include a rigid circuit board.

As illustrated in FIG. 2, the electronic module EM may include a control module 10, a wireless communication module 20, an image input module 30, a sound input module 40, a sound output module 50, a memory 60, an external interface 70, a light emitting module 80, a light receiving module 90, a camera module 100, and the like. Some of the above-described modules may be electrically connected to the motherboard through a flexible circuit board or an electronic component connector instead of being mounted to the motherboard.

The control module 10 controls an overall operation of the electronic device ED. The control module 10 may be a microprocessor. For example, the control module 10 activates or deactivates the display device DD. The control module 10 may control, on the basis of a user's input signal received from the display device DD, the image input module 30, the sound input module 40, the sound output module 50, and the like.

The wireless communication module 20 may transceive a wireless signal with another terminal by using Bluetooth or WiFi link. The wireless communication module 20 may use a general communication line to transceive a voice signal. The wireless communication module 20 includes a transmission part 22 modulating a signal to be transmitted to transmit the modulated signal and a receiving part 24 demodulating the received signal.

The image input module 30 processes an image signal to convert the image signal into image data that is displayable on the display device DD. The sound input module 40 receives an external sound signal through a microphone in a recording mode or a voice recognition mode to convert the received sound signal into electrical voice data. The sound output module 50 converts sound data received from the wireless communication module 20 or sound data stored in the memory 60 to output the converted sound data to the outside.

The external interface 70 serves as an interface connected to an external charger, a wire/wireless data port, a card socket (e.g., memory card socket and SIM/UIM card socket), or the like.

The light emitting module 80 generates and outputs light. The light emitting module 80 may output infrared rays. The light emitting module 80 may include a LED element. The light receiving module 90 may detect infrared rays. The light receiving module 90 may be activated when infrared rays above a predetermined level is detected. The light receiving module 90 may include a CMOS sensor. Infrared light generated from the light emitting module 80 may be outputted and then reflected by an external object (e.g. user's finger or face), and the reflected infrared light may be incident into the light receiving module 90. Each of the light emitting module 80 and the light receiving module 90 may be provided in plurality according to a purpose. The camera module 100 photographs an external image. The camera module 100 may be provided in plurality according to a purpose and a position of being mounted to the electronic device ED.

As illustrated in FIG. 2, the display device DD includes a display panel DP and an input sensing panel ISP. The display panel DP generates the image IM of FIG. 1A. The input sensing panel ISP may detect a user's input.

Figure 3A:
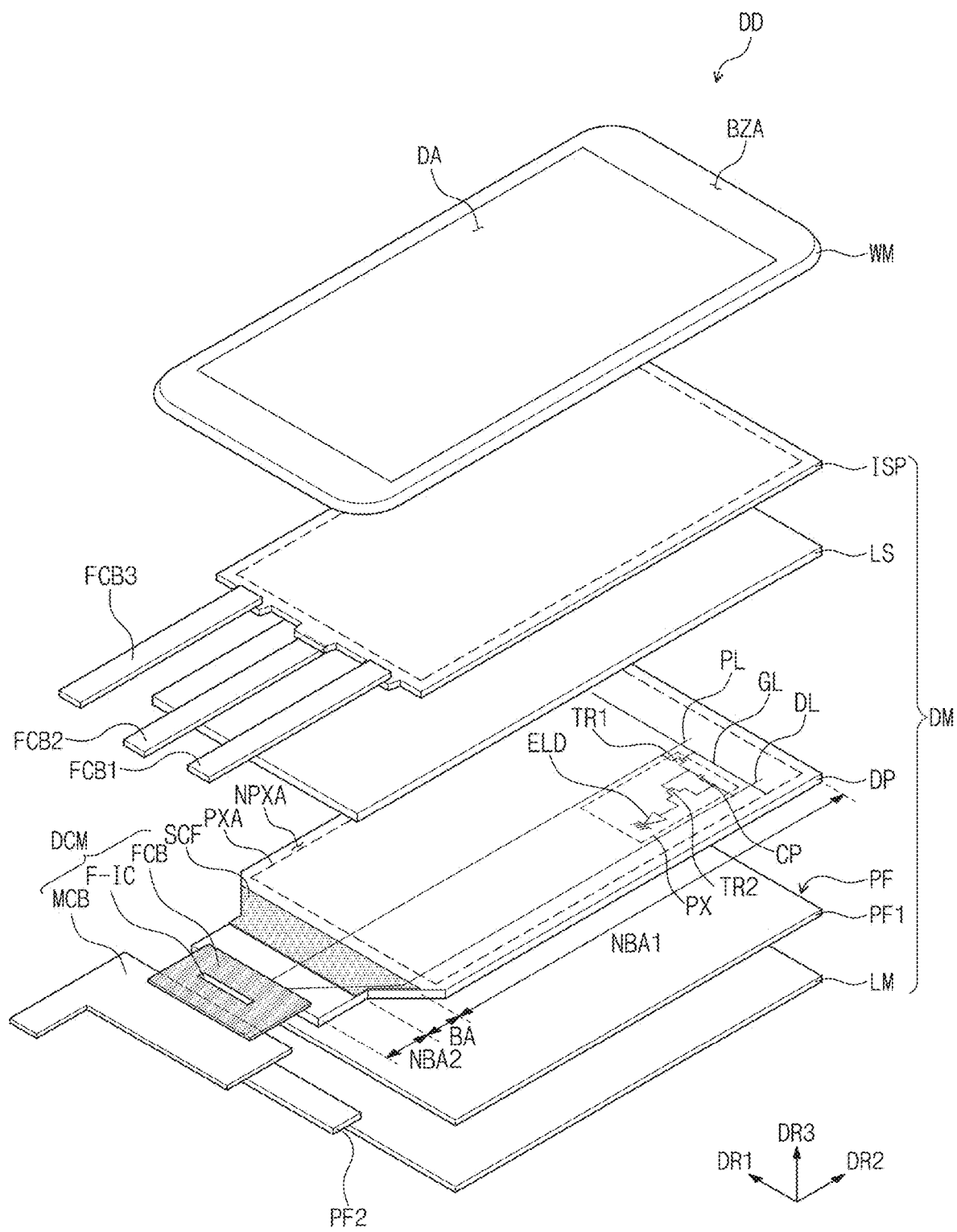
FIG. 3A is an exploded perspective view illustrating a display device according to an exemplary embodiment of the inventive concepts.
Figure 3B:
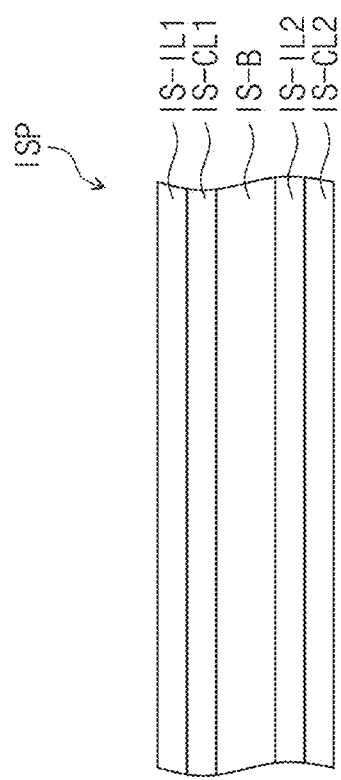
FIG. 3B is a cross-sectional view illustrating an input sensing panel according to an exemplary embodiment of the inventive concepts.
Figure 3C:
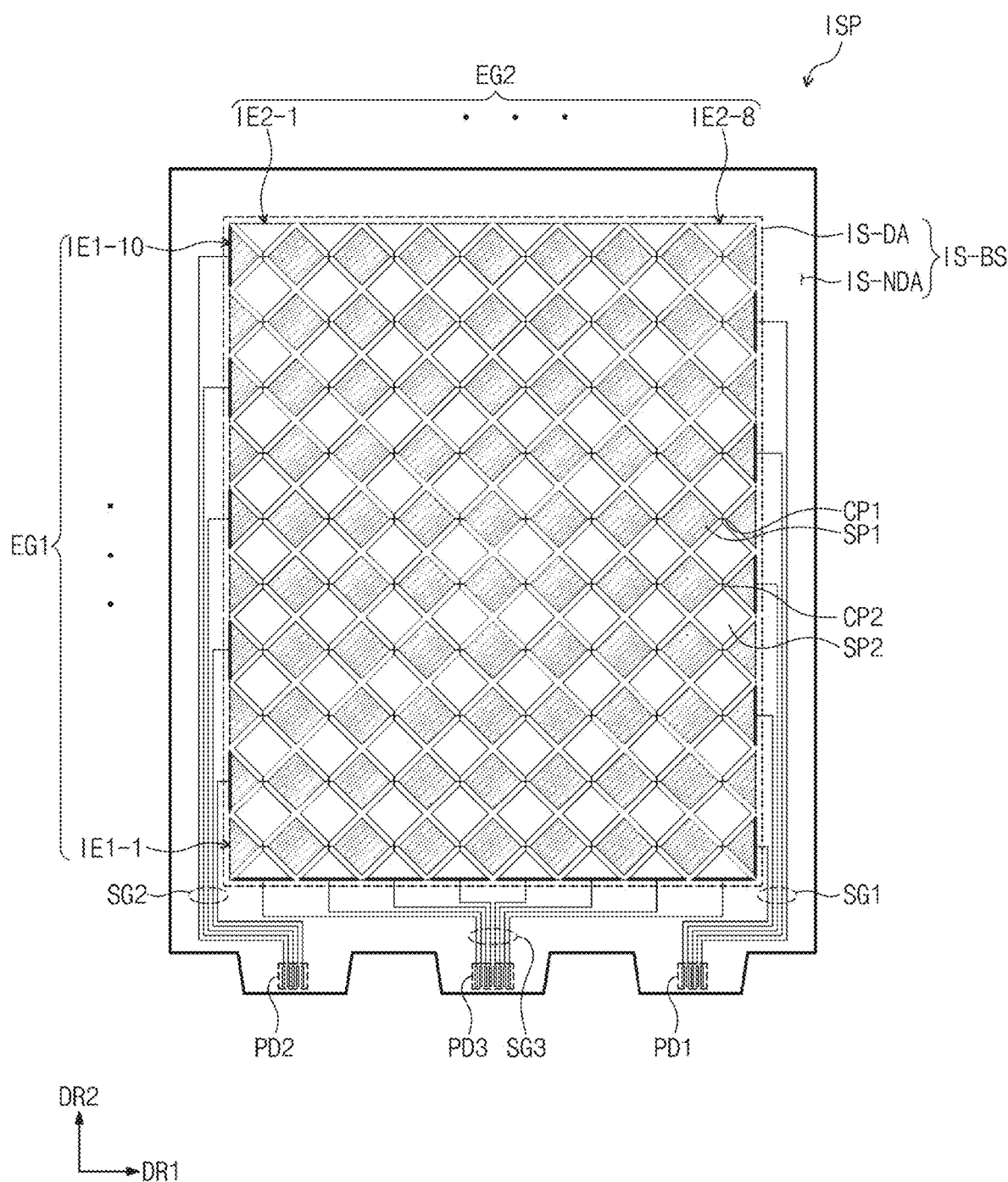
FIG. 3C is a plan view illustrating an input sensing panel according to an exemplary embodiment of the inventive concepts.
Figure 3D:
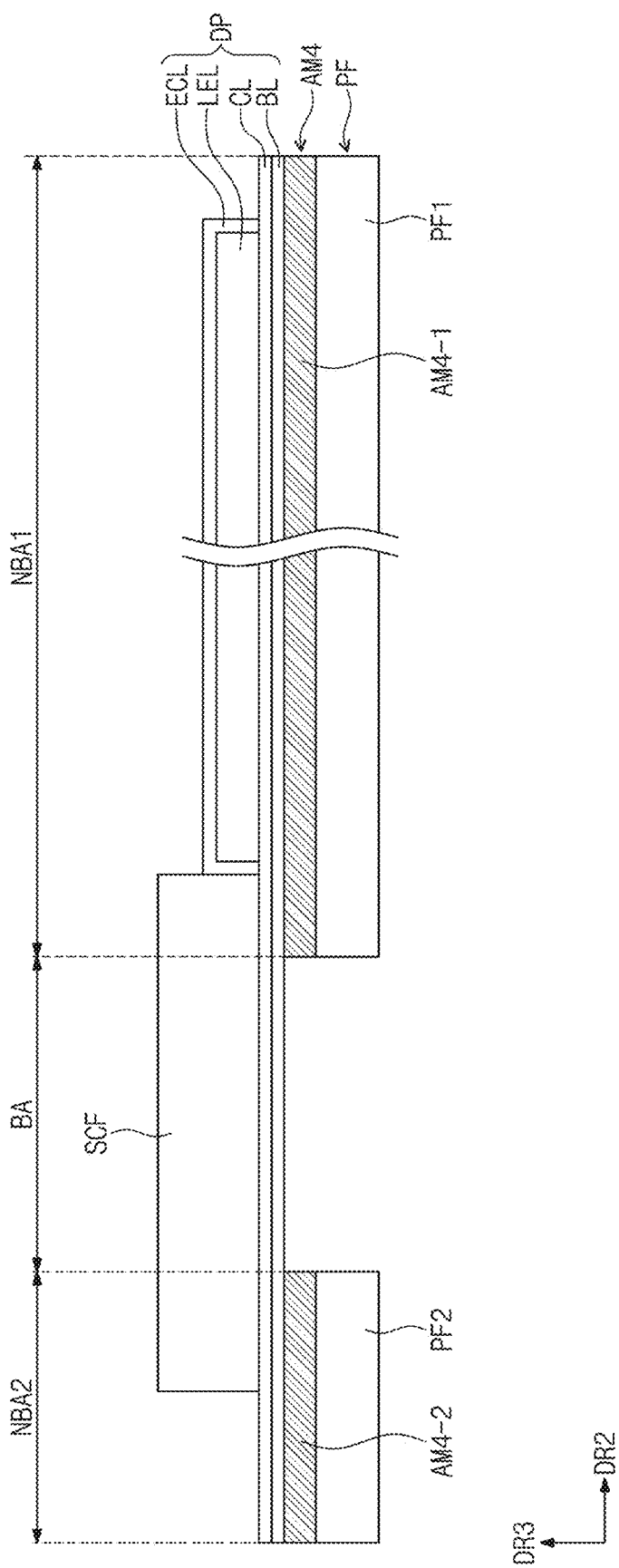
FIG. 3D is a cross-sectional view illustrating a display panel according to an exemplary embodiment of the inventive concepts.

FIG. 3A is an exploded perspective view illustrating the display device DD according to an exemplary embodiment of the inventive concepts. FIG. 3B is a cross-sectional view illustrating the display panel DP according to an exemplary embodiment of the inventive concepts. FIG. 3C is a plan view illustrating the input sensing panel ISP according to an exemplary embodiment of the inventive concepts. FIG. 3D is a cross-sectional view illustrating the input sensing panel ISP according to an exemplary embodiment of the inventive concepts. In FIG. 3A, adhesive members are not illustrated.

As illustrated in FIG. 3A, the display device DD includes a window WM and a display module DM. The window WM includes a base layer and a bezel layer disposed on a bottom surface of the base layer. An area on which the bezel layer is disposed is defined as the bezel area BZA. Although the window WM having a flat shape in the display area DA is illustrated in the exemplary embodiment, the shape of the window WM may be changed. The edges of the window WM, which face each other in the first direction DR1, may provide a curved shape.

The base layer may include a glass substrate, a sapphire substrate, a plastic substrate, or the like. The base layer may have a single-layer or multilayer structure. For example, the base layer BS may include a plurality of synthetic resin films, which are coupled by an adhesive agent. The base layer BS may include a glass substrate and a synthetic resin film that is coupled to the glass substrate by an adhesive member.

The bezel layer may be directly disposed on a bottom surface of the glass substrate or directly disposed on one surface of the synthetic resin film. An organic material and/or an inorganic material may be directly deposited or printed on the glass substrate. The synthetic resin film including a bezel layer may be attached to a bottom surface of the glass substrate.

The bezel layer may have a single-layer or multilayer structure. The multilayered bezel layer may include a buffer layer for improving an adhesion force, a pattern layer providing a predetermined pattern, and an achromatic layer. The pattern layer may provide a pattern that is referred to as a hairline. The achromatic layer may include an organic mixture containing a black pigment or dye. The above-described layers may be provided through methods such as deposition, printing, and coating. Although not separately shown, the window WM may further include a functional coating layer disposed on a top surface of the base layer BS. The functional coating layer may include a fingerprint-proof layer, a reflection preventing layer, and a hard coating layer.

As illustrated in FIG. 3A, the display module DM may include an input sensing panel ISP, an optical sheet LS, a display panel DP, a protection film PF, a driving control module DCM, connection circuit boards FCB1, FCB2, and FCB3, a lower side member LM, and a stress control film SCF. An adhesive member may be provided between the input sensing panel ISP and the optical sheet LS, between the optical sheet LS and the display panel DP, between the display panel DP and the protection film PF, and between the protection film PF and the lower side member LM. The adhesive member may be a conventional adhesive agent or gluing agent and have a sheet type or a resin type. The adhesive member may be a pressure sensitive adhesive film (PSA), an optically clear adhesive film (OSA), or an optically clear resin (OCR).

The input sensing panel ISP acquires coordinate information of a user's input. The input sensing panel ISP may detect various types of inputs provided from the outside of the electronic device ED. For example, the input sensing panel ISP may detect an input generated by a body of a user and various types of external inputs such as light, heat, or pressure. Also, the input sensing panel ISP may also detect an input of contacting a sensing surface and an input of being adjacent to the sensing surface. The input sensing panel ISP may include, e.g., a capacitive touch panel and an electromagnetic induction touch panel.

As illustrated in FIG. 3B, the input sensing panel ISP may include a base layer IS-B, a first conductive layer IS-CL1, a first insulation layer IS-IL1, a second conductive layer IS-CL2, and a second insulation layer IS-IL2. The first conductive layer IS-CL1 and the first insulation layer IS-IL1 may be disposed on one surface of the base layer IS-B, and the second conductive layer IS-CL2 and the second insulation layer IS-IL2 may be disposed on one surface of the base layer IS-B.

The base layer IS-B may include a glass substrate or a synthetic resin film. Each of the first conductive layer IS-CL1 and the second conductive layer IS-CL2 may have a single-layer structure or a multilayer structure in which a plurality of layers are laminated in the third directional axis DR3. The conductive layer having the multilayer structure may include at least two of the transparent conductive layers and the metal layers. The conductive layer having the multilayer structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may include molybdenum, silver, titanium, copper, aluminum, and an alloy thereof. For example, each of the first and second conductive layers IS-CL1 and IS-CL2 may have a three-layer metal layer structure, e.g., a three-layer structure of titanium/aluminum/titanium.

Each of the first and second conductive layers IS-CL1 and IS-CL2 may include a plurality of conductive patterns. Hereinafter, it is assumed that the first conductive layer IS-CL1 includes first conductive patterns, and the second conducive layer IS-CL2 includes second conductive patterns. Each of the first conductive patterns and the second conductive patterns may include touch electrodes and touch signal lines connected thereto.

Each of the first insulation layers IS-IL1 and the second insulation layer IS-IL2 may include an inorganic layer and/or an organic layer. The inorganic layer may include at least one of aluminum oxide, titanium oxide, silicon oxide, silicon oxide nitride, zirconium oxide, or hafnium oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. In an exemplary embodiment of the inventive concepts, the first insulation layer IS-IL1 and the second insulation layer IS-IL2 may be omitted.

As illustrated in FIG. 3C, the input sensing panel ISP may include a sensing area IS-DA and a line area IS-NDA, which correspond to the display area DA (refer to FIG. 1A) and the bezel area BZA (refer to FIG. 1A), respectively. Exemplary embodiments of the inventive concepts are not limited to the state in which the sensing area IS-DA has the same surface area or shape as that of the display area DA (refer to FIG. 1A).

The input sensing panel ISP may include a first electrode group EG1, a second electrode group EG2, a first signal line group SG1 connected to one portion of the first electrode group EG1, a second signal line group SG2 connected to another portion of the first electrode group EG1, and a third signal line group SG3 connected to the second electrode group EG2.

Odd-numbered electrodes of electrodes of the first electrode group EG1 may be connected to the first signal line group SG1, and even-numbered electrodes of the electrodes of the first electrode group EG1 may be connected to the second signal line group SG2. Each of the electrodes of the first electrode group EG1 includes a plurality of first sensor parts SP1 and a plurality of first connection parts CP1. Each of electrodes of the second electrode group EG2 includes a plurality of second sensor parts SP2 and a plurality of second connection parts CP2. Exemplary embodiments of the inventive concepts are not particularly limited to the shape of each of the first electrode group EG1 and the second electrode group EG2.

The first electrode group EG1, the first signal line group SG1, and the second signal line group SG2 may be provided from the first conductive layer IS-CL1 in FIG. 3B. The second electrode group EG2 and the third signal line group SG3 may be provided from the second conductive layer IS-CL2 in FIG. 3B. First to third pads PD1 to PD3 in FIG. 3C may be a portion of signal lines of the first to third signal line groups SG1 to SG3 or a conductive pattern provided by an additional process.

The first electrode group EG1, the first signal line group SG1, and the second signal line group SG2 may be disposed on a different layer from that of the second electrode group EG2 and the third signal line group SG3.

As illustrated in FIG. 3A, the first and third connection circuit boards FCB1 and FCB3 of the first to third connection circuit boards FCB1, FCB2, and FCB3 are connected through a top surface of the input sensing panel ISP. The first and third connection circuit boards FCB1 and FCB3 may be connected to the first pads PD1 and the second pads PD2 of FIG. 3C. When the first pads PD1 and the second pads PD2 are consecutively arranged at one side of the line area IS-NDA, the first and third connection circuit boards FCB1 and FCB3 may be replaced by one connection circuit board connected to the first pads PD1 and the second pads PD2.

The second connection circuit board FCB2 is connected through a bottom surface of the input sensing panel ISP. The second connection circuit board FCB2 may be connected to the third pads PD3 of FIG. 3C. Connected positions (connected positions on the front surface or the bottom surface) of the connection circuit boards FCB1 to FCB3 with respect to the input sensing panel ISP may be determined according to positions of the first to third pads PD1 to PD3 with respect to the base layer IS-B.

The optical sheet LS in FIG. 3A may include a polarizer or a retarder. The polarizer and the retarder may include an elongated polarizing film and an elongated retarder film. The number of the retarder and a phase delay length ($\lambda/4$ or $\lambda/2$) of the retarder may be determined according to an operation principle of the optical sheet LS. In an exemplary embodiment, the polarizer and the retarder may be a coating-type polarizing film and a coating-type retarder film, which are obtained such that a liquid crystal composition is applied/oriented on a base film, respectively.

The display panel DP in FIG. 3A may be a flexible display panel, e.g., an organic light emitting display panel. The display panel DP includes a pixel area PXA on which a pixel PX is disposed and a non-pixel area NPXA disposed adjacent to the pixel area PXA. On the non-pixel area NPXA, peripheral components such as signal lines and insulation patterns are disposed instead of the pixel PX. The pixel area PXA and the non-pixel area NPXA may correspond to the display area DA (refer to FIG. 1A) and the bezel area BZA (refer to FIG. 1A), respectively. Here, the corresponding areas are unnecessary to be completely the same (e.g., shape/surface area or the like).

The pixel PX may be provided in plurality and connected to corresponding signal lines, respectively. The pixel PX may include a first thin-film transistor TR1, a second thin-film transistor TR2, a capacitor CP, and a light emitting element ELD.

The first thin-film transistor TR1 is connected to a gate line GL and a data line DL. The light emitting element ELD receives a power voltage that is provided to a power line PL. Pads connected to the signal lines such as the data line DL and the power line PL are disposed on the non-pixel area NPXA.

In FIG. 3D, a laminated structure of the display panel DP is simply illustrated. As illustrated in FIG. 3D, the display panel DP includes a base layer BL, a circuit layer CL, a display element layer LEL, and an encapsulation layer ECL.

The base layer BL may include a synthetic resin film, e.g., a polyimide (PI) film. However, the exemplary embodiments of the inventive concepts are not particularly limited to the material of the base layer BL. The circuit layer CL is disposed on a top surface of the base layer BL. The circuit layer CL has a multilayer structure including an insulation layer, a conductive layer, and a semiconductor layer. The circuit layer CL includes a pixel circuit such as the first thin-film transistor TR1, the second thin-film transistor TR2, and the capacitor CP and signal lines connected to the pixel circuit.

The display element layer LEL is disposed on a top surface of the circuit layer CL. The display element layer LEL may include the light emitting element ELD, e.g., an organic light emitting element. The encapsulation layer ECL is disposed on the display element layer LEL to seal the display element layer LEL. The encapsulation layer ECL may have an organic layer/inorganic layer double layer structure that is referred to as thin film encapsulation TFE. The encapsulation layer ECL may include only an inorganic layer or only an organic layer. The display panel DP may include an encapsulation substrate, which is a replacement of the encapsulation layer ECL, and a sealant. The sealant may couple the encapsulation substrate on the display element layer LEL.

As illustrated in FIG. 3D, the display panel DP may include three areas. That is, the display panel DP may include a first non-bending area NBA1, a bending area BA that is bendable from the first non-bending area NBA1, and a second non-bending area NBA2 that extends from the bending area BA. In a bent state, the second non-bending area NBA2 faces the first non-bending area NBA1. The bending area BA has a predetermined curvature in the bent state.

The base layer BL and the circuit layer CL may be disposed in correspondence to the first and second non-bending areas NBA1 and NBA2 and the bending area BA. The display element layer LEL and the encapsulation layer ECL may be disposed on the first non-bending area NBA1.

Hereinafter, a planar shape of the display panel DP in a spread state will be described in detail with reference to FIG. 3A again. The display panel DP may have a width in the first direction DR1, i.e., a width in a direction parallel to a bending axis, which is different for each area. The bending area BA may have a width less than that of the first non-bending area NBA. As the bending area BA has a relatively small width, bending is easily carried out.

In FIG. 3A, the bending area BA includes an area having a width in the first direction DR1, which gradually decreases in a direction away from the first non-bending area NBA1. In an exemplary embodiment of the inventive concepts, the bending area BA may have a constant width.

Referring to FIGS. 3A and 3D, the protection film PF is disposed on a bottom surface of the display panel DP. In the exemplary embodiment, the protection film PF may include a first protection film PF1 and a second protection film PF2, which are spaced apart from each other.

The protection film PM may include a synthetic resin film as a base layer. The protection film PF may include one selected from the group consisting of polyethersulphone (PES), polyacrylate (PAR), polyetherimide (PEI), polyethyelenen naphthalate (PEN), polyethyeleneterepthalate(PET), polyphenylene sulfide (PPS), polyallylate, polyimide (PI), polycarbonate (PC), poly(aryleneether sulfone), and a combination thereof.

However, the exemplary embodiments of the inventive concepts are not limited to the material of the protection film PM. For example, the protection film PF may include an organic/inorganic composite material. The protection film PF may include a porous organic layer and an inorganic material that is filled into pores of the organic layer.

As illustrated in FIG. 3D, the display panel DP and the protection film PF may be coupled by an adhesive member AM4 (hereinafter, referred to as a fourth adhesive member). The fourth adhesive member AM4 may include a first adhesive portion AM4-1 and a second adhesive portion AM4-2, which correspond to the first protection film PF1 and the second protection film PF2, respectively.

As illustrated in FIG. 3A, the driving control module DCM may include a first circuit board MCB (or driving circuit board), a second circuit board FCB that connects the first circuit board MCB and the display panel DP, and a driving chip F-IC mounted to the second circuit board FCB. Although not separately shown, a plurality of passive elements and a plurality of active elements may be mounted to the first circuit board MCB. The first circuit board MCB may be a rigid circuit board or a flexible circuit board, and the second circuit board FCB may be a flexible circuit board.

Although not separately shown, a driving chip of the input sensing panel ISP may be mounted to the first circuit board MCB. The connection circuit boards FCB1, FCB2, and FCB3 may be connected to the first circuit board MCB. Also, the first circuit board MCB may be electrically connected to the motherboard of the electronic module (refer to FIG. 1B) through an electronic component connector.

The lower side member LM may be disposed on a bottom surface of the protection film PF and include a support substrate or a pressure detecting sensor. The support panel SPP is disposed on the bottom surface of the protection film PF to support the display panel DP and the protection film PF. The support panel SPP may be a metal plate having a rigidity above reference. The support panel SPP may be a stainless steel plate. The support panel SPP may have a black color to block external light incident to the display panel DP.

The pressure detecting sensor may detect an external pressure applied to the display module. The pressure detecting sensor may include a base layer, piezoelectric elements, and signal lines connected to the piezoelectric elements.

Referring to FIGS. 3A and 3D, the display panel DP may further include a stress control film SCF disposed on the circuit layer in correspondence to at least the bending area BA. About 50% or more of an entire area of the stress control film SCF may be disposed on the bending area BA. A portion of the stress control film SCF may also overlap the first non-bending area NBA1 and the second non-bending area NBA2. The stress control film SCF may include a synthetic resin film. The stress control film SCF may be made of one of the previously described synthetic resin films used for the protection film PF.

Figure 4A:
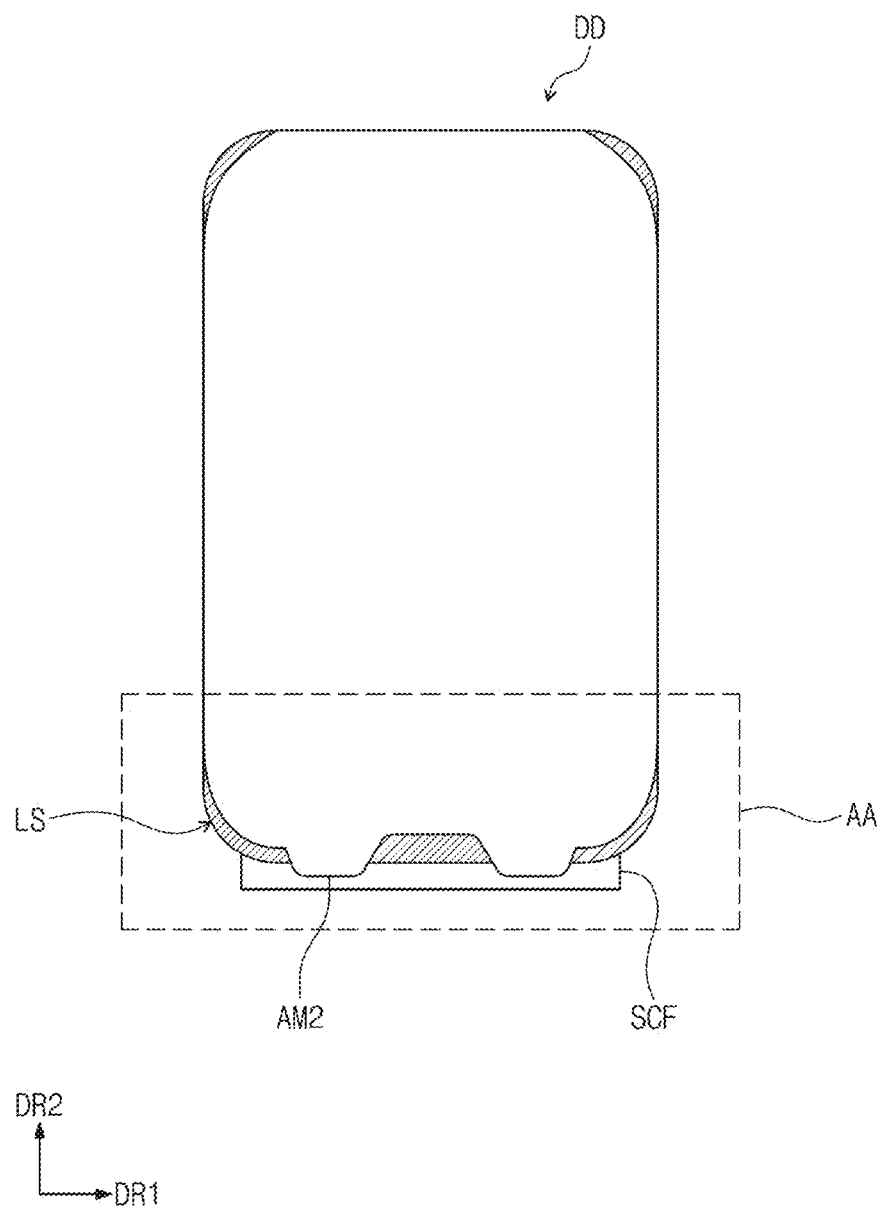
FIG. 4A is a plan view illustrating the display device according to an exemplary embodiment of the inventive concepts.
Figure 4B:
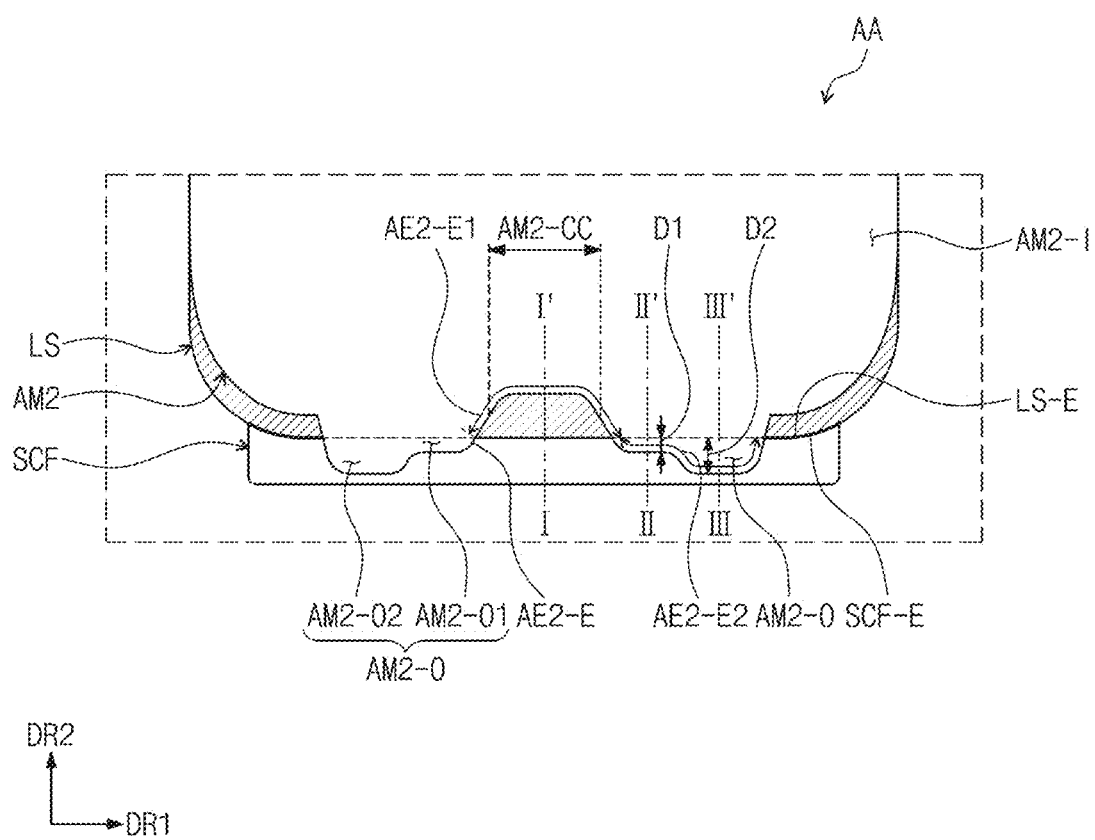
FIG. 4B is an enlarged plan view illustrating area AA of FIG. 4A.

FIG. 4A is a plan view illustrating the display device DD according to an exemplary embodiment of the inventive concept. FIG. 4B is an enlarged plan view illustrating area AA of FIG. 4A. FIGS. 4C to 4F are cross-sectional views illustrating the display device DD according to an exemplary embodiment of the inventive concepts.

In FIG. 4A, the display device DD of FIG. 3A in a coupled state is illustrated. In FIG. 4A, the display device DD, from which the window WM and the input sensing panel ISP of FIG. 3A are removed, is illustrated. Accordingly, the adhesive member AM2 (hereinafter, referred to as a second adhesive member) for coupling the input sensing panel ISP and the optical sheet LS is disposed on an uppermost layer. On a plane, a partial area of the optical sheet LS, which non-overlaps the second adhesive member AM2, is illustrated. Also, a partial bent area of the stress control film SCF, which non-overlaps the second adhesive member AM2, is illustrated.

Figure 4C:
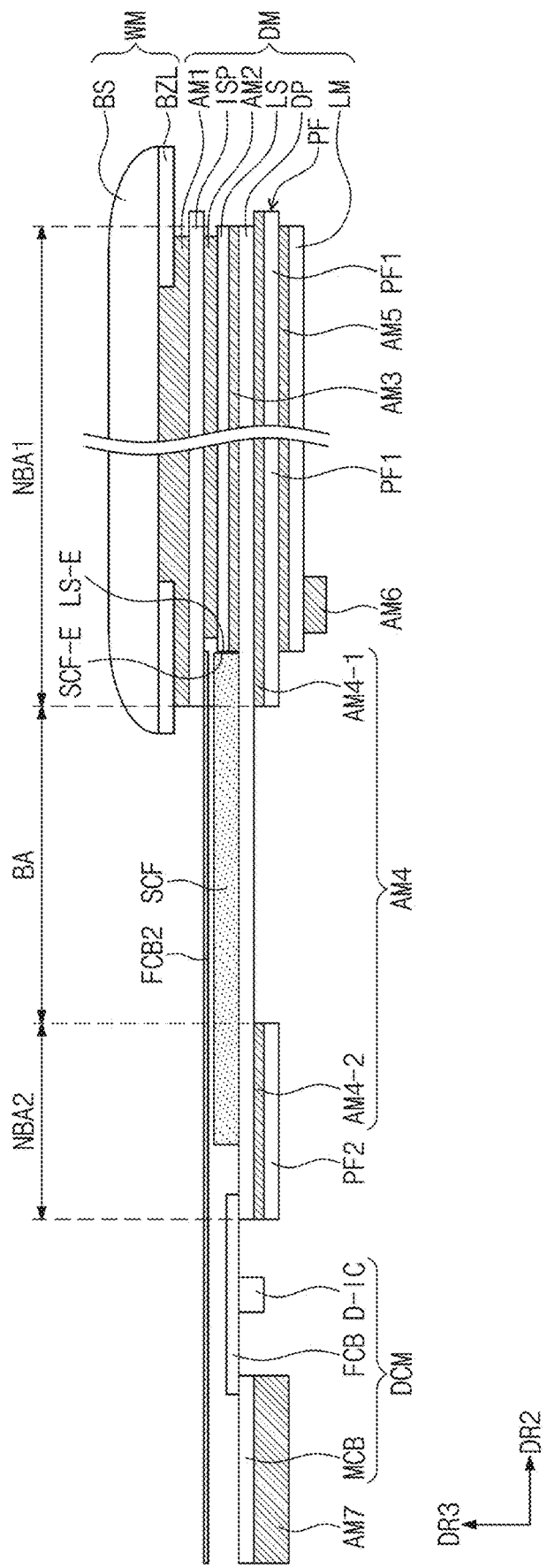
FIGS. 4C, 4D, 4E, and 4F are cross-sectional views illustrating the display device according to an exemplary embodiment of the inventive concepts.
Figure 4D:
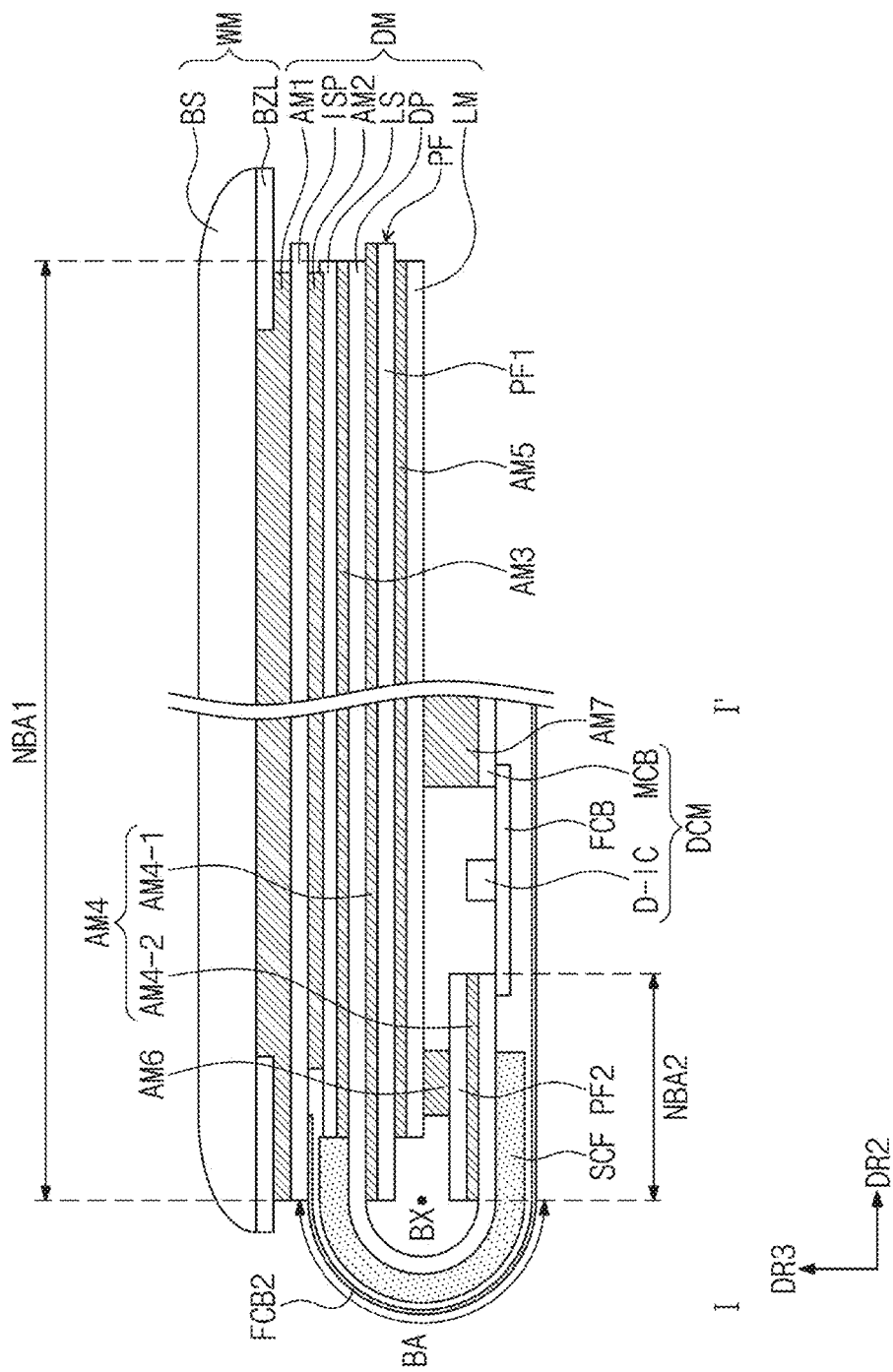
Figure 4E:
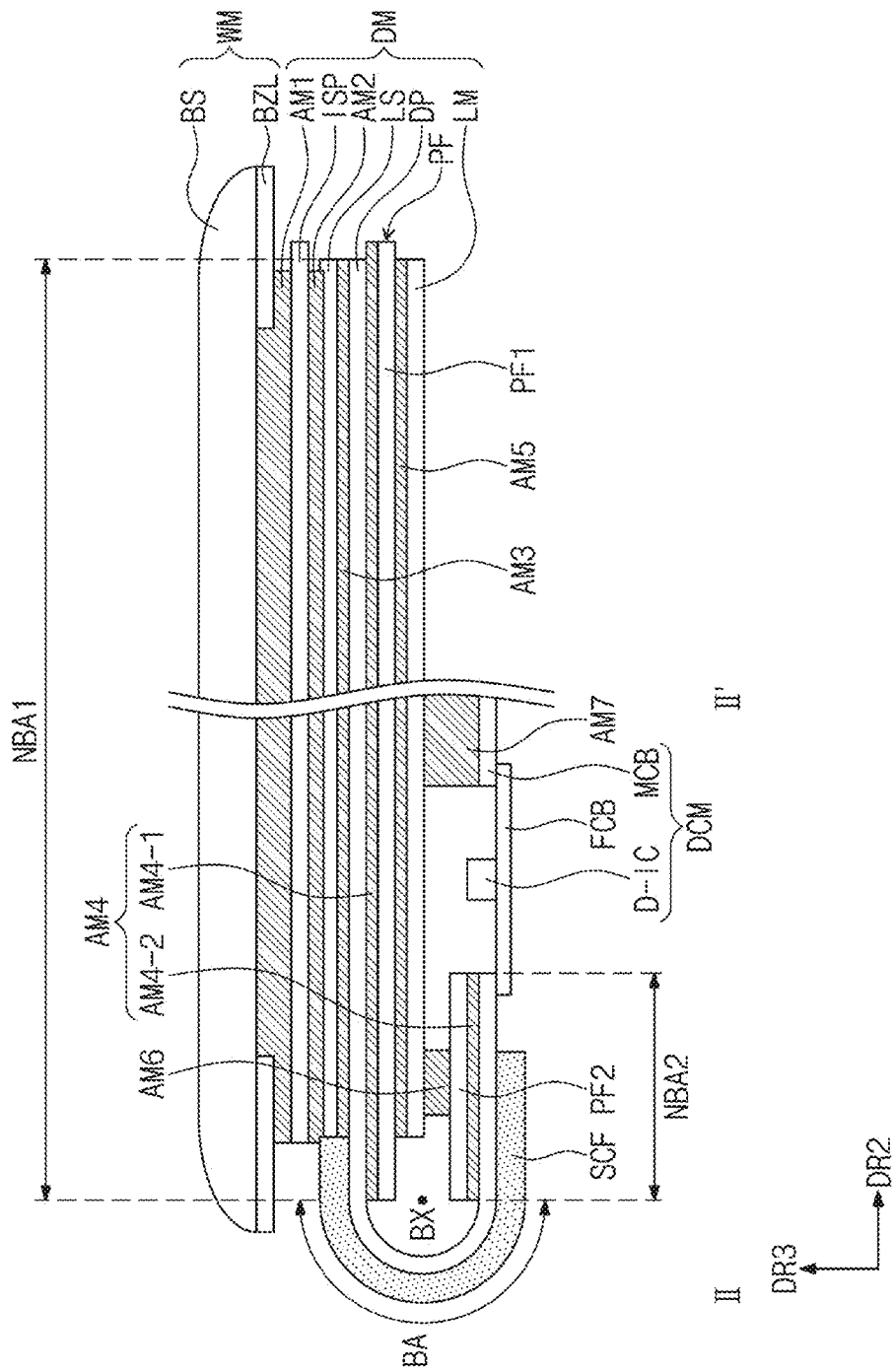
Figure 4F:
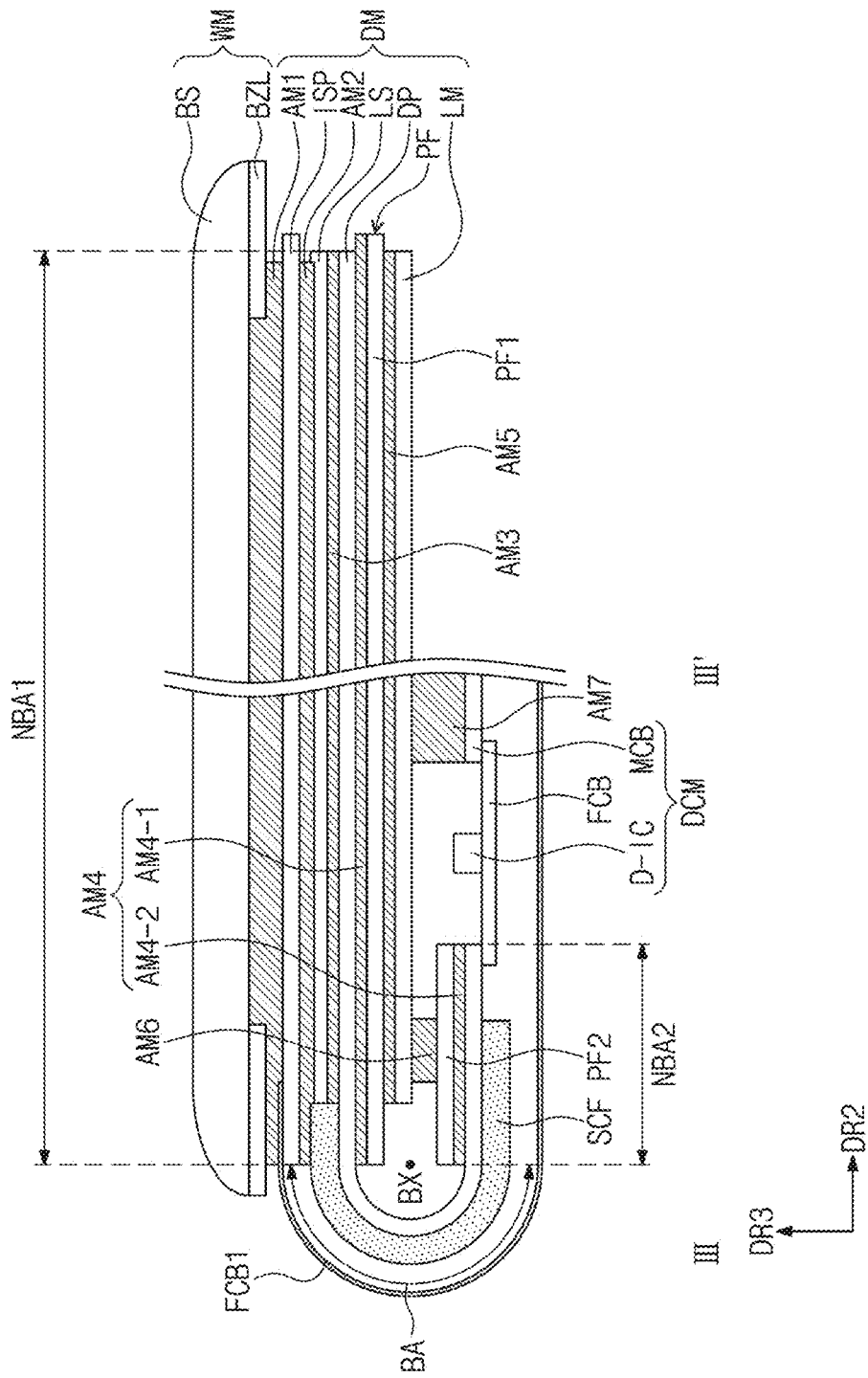

FIG. 4B is an enlarged view illustrating area AA of FIG. 4A. FIGS. 4C and 4D are cross-sectional views taken along line I-I' of FIG. 4B. FIG. 4C illustrates a state in which the display panel DP is spread, and FIG. 4D illustrates a state in which the display panel DP is bent. FIG. 4E is a cross-sectional view taken long line II-II' of FIG. 4B. FIG. 4F is a cross-sectional view taken long line III-III' of FIG. 4B. In FIGS. 4C to 4F, the display panel DP described in FIG. 3D has a single layer.

In FIGS. 4C to 4F, the window WM including the base layer BS and the bezel layer BZL directly disposed on a bottom surface of the base layer BS. The adhesive member AM1 (hereinafter, referred to as a first adhesive member) between the input sensing panel ISP and the optical sheet LS, the adhesive member AM3 (hereinafter, referred to as a third adhesive member) between the optical sheet LS and the display panel DP, and the adhesive member AM5 (hereinafter, referred to as a fifth adhesive member) between the protection film PF and the lower side member LM, which are previously described, are illustrated.

An adhesive member AM6 (hereinafter, referred to as a sixth adhesive member) may be disposed between the second protection film PF2 and the lower side member LM, and an adhesive member AM7 (hereinafter, referred to as a seventh adhesive member) may be further disposed between the first circuit board MCB and the lower side member LM. The sixth adhesive member AM6 serves as a spacer that maintains a distance between the second protection film PF2 and the lower side member LM while maintaining a curvature radius.

Although not shown, an adhesive layer is disposed between the stress control film SCF and the display panel DP. One area of the stress control film SCF overlaps the first non-bending area NBA1, and another area thereof overlaps the second non-bending area NBA2. Most of areas of the stress control film SCF form a curvature with respect to the bending axis BX like the bending area BA of the display panel DP.

Referring to FIG. 4B, the second adhesive member AM2 includes an inner portion AM2-I and an outer portion AM2-O extending from the inner portion AM2-I. A portion of the second adhesive member AM2, which overlaps the optical sheet LS, may be defined as the inner portion AM2-I. On a plane, the outer portion AM2-O may be defined as a portion extending from the inner portion AM2-I to the outside and non-overlapping the optical sheet LS. At least a portion of the outer portion AM2-O may overlap the stress control film SCF.

In FIG. 4B, only the outer portion AM2-O overlapping the stress control film SCF is illustrated. In FIG. 4B, two outer portions AM2-O, which are spaced apart from each other in the first direction DR1, are illustrated. In FIG. 4B, two outer portions AM2-O, which are symmetric to each other, are exemplarily illustrated.

The outer portion AM2-O may include areas, which are distinguished from each other. In FIG. 4B, the outer portion AM2-O including a first area AM2-O1 and a second area AM2-O2, which have different widths in the second direction DR2 from each other, is exemplarily illustrated. A first portion AM2-E1 of an edge AM2-E of the second adhesive member AM2 may define a recessed area AM2-CC that is recessed toward a center area of the inner portion AM2-I so that a partial area of the optical sheet LS is exposed.

As illustrated in FIGS. 4B to 4D, a boundary between the outer portion AM2-O and the inner portion AM2-I may be set by an edge LS-E of the optical sheet LS. An edge SCF-E of the stress control film SCF, which faces the edge LS-E of the optical sheet LS, may be disposed adjacent to the boundary between the outer portion AM2-O and the inner portion AM2-I. The edge LS-E of the optical sheet LS and the edge SCF-E of the stress control film SCF may be disposed adjacent to each other within a distance of several mm.

A second portion AM2-E2 of an edge AM2-E of the second adhesive member AM2 may define the first area AM2-O1 and the second area AM2-O2. The first area AM2-O1 may be defined as an area in which a distance between an edge LS-E of the optical sheet LS and a second portion AM2-E2 of the edge AM2-E is a first distance D1. The second area AM2-O2 may be defined as an area in which a distance between the edge LS-E of the optical sheet LS and the second portion AM2-E2 of the edge AM2-E is defined as a second distance D2 that is greater than the first distance D1. Each of the first distance D1 and the second distance D2 may be the width in the second direction DR2 in a corresponding area.

Referring to FIGS. 4B and 4D, although the second connection circuit board FCB2 is connected to the third pad PD3 (refer to FIG. 3C) through the bottom surface of the input sensing panel ISP, as a connection area of the second connection circuit board FCB2 is disposed inside the recessed area AM2-CC, a lifting phenomenon between the input sensing panel ISP and the second adhesive member AM2 may be prevented. The connection area of the second connection circuit board FCB2 may be defined as a partial area overlapping the input sensing panel ISP.

Referring to FIGS. 4B, 4E, and 4F, the second area AM2-O2 having a second directional width greater than that of the first area AMw-O1 overlaps a connection area of the first connection circuit board FCB1. As the second area AM2-O2 having a surface area greater than that of the first area AM2-O1 sufficiently supports the connection area of the first connection circuit board FCB1, a coupling force between the first connection circuit board FCB1 and the input sensing panel ISP may increase.

As illustrated in FIG. 4F, the first adhesive member AM1 overlaps the connection area of the first connection circuit board FCB1 and is attached to the first connection circuit board FCB1. The first adhesive member AM1 may prevent a lifting phenomenon of the first connection circuit board FCB1. Although not separately shown, for the same purpose, the first adhesive member AM1 may overlap a connection area of the third connection circuit board FCB3 and be attached to the third connection circuit board FCB3.

Referring to FIGS. 4B, 4E, and 4F, as the first area AM2-O1 and the second area AM2-O2 overlap and are attached to the stress control film SCF, a delamination phenomenon occurring in an area overlapping the first non-bending area NBA1 of the stress control film SCF may be prevented. This is because a coupling force between the second adhesive member AM2 and the stress control film SCF cancels out a stress generated by a bending phenomenon of the stress control film SCF. This will be described in more detail with reference to FIGS. 5A and 5B.

Figure 5A:
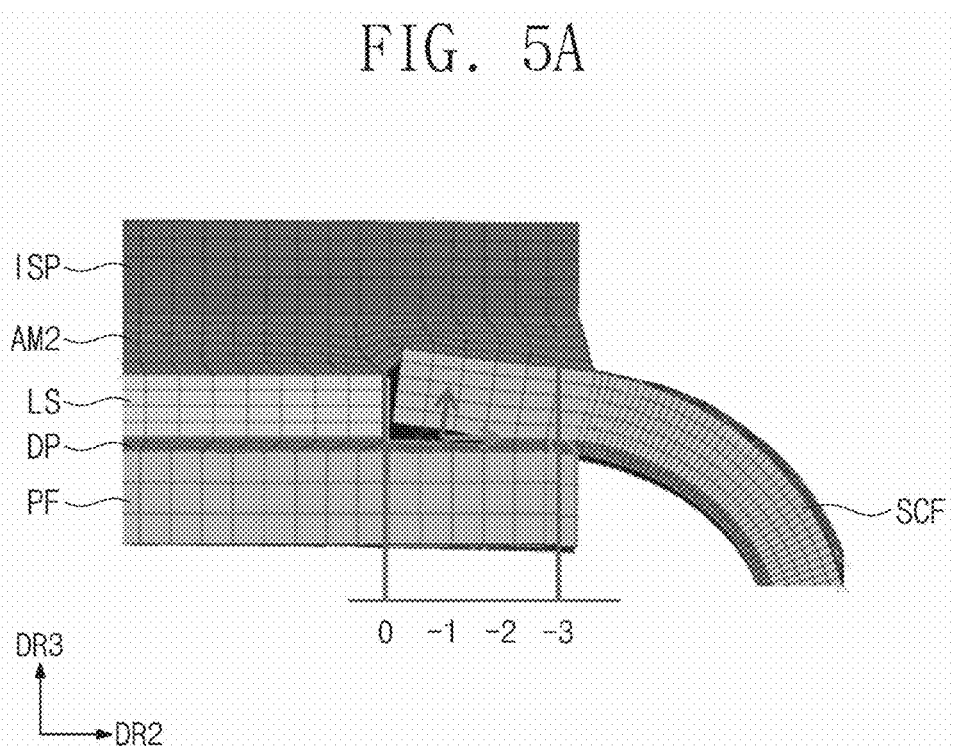
FIG. 5A is a view illustrating a stress generated in a portion of the display device according to an exemplary embodiment of the inventive concepts.
Figure 5B:
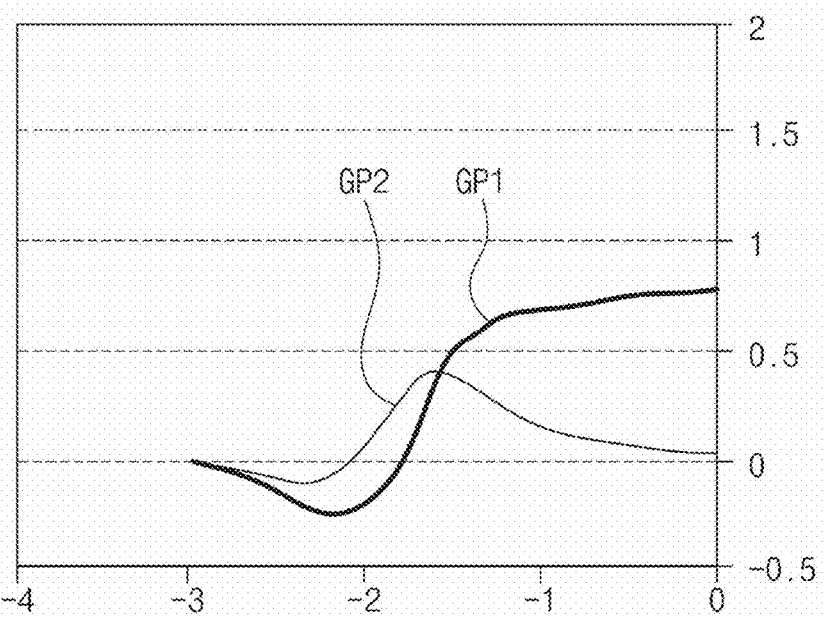
FIG. 5B is a graph showing the stress generated in a portion of the display device DD in FIG. 5A.

FIG. 5A is a view illustrating a stress generated in a portion of the display device DD according to an exemplary embodiment of the inventive concepts. FIG. 5B is a graph showing the stress generated in a portion of the display device DD in FIG. 5A. Referring to FIG. 5A, since a thin adhesive layer in comparison with the third adhesive member AM3 in FIGS. 4C to 4F is disposed, the adhesive layer is not separately illustrated in FIG. 5A.

When the stress control film SCF is bent while being attached to the display panel DP, a great stress may be generate on an end of the stress control film SCF by a restoration force of the stress control film SCF to be restored into a flat state. Referring to FIG. 5A, the stress is generated in the third direction DR3 and the second direction DR2. A first graph GP1 of FIG. 5B represents a shear stress (stress in the second direction DR2) in a structure in which the first area AM2-O1 and the second area AM2-O2 in FIGS. 4B, 4E, and 4F are not provided, and a second graph GP2 of FIG. 5B represents a shear stress (stress in the second direction DR2) in a structure in which the first area AM2-O1 and the second area AM2-O2 are provided. As described above, as a coupling force between the outer portion AM2-O and the stress control film SCF cancels out a stress generated by a bending phenomenon of the stress control film SCF, the shear stress may decrease.

Figure 6A:
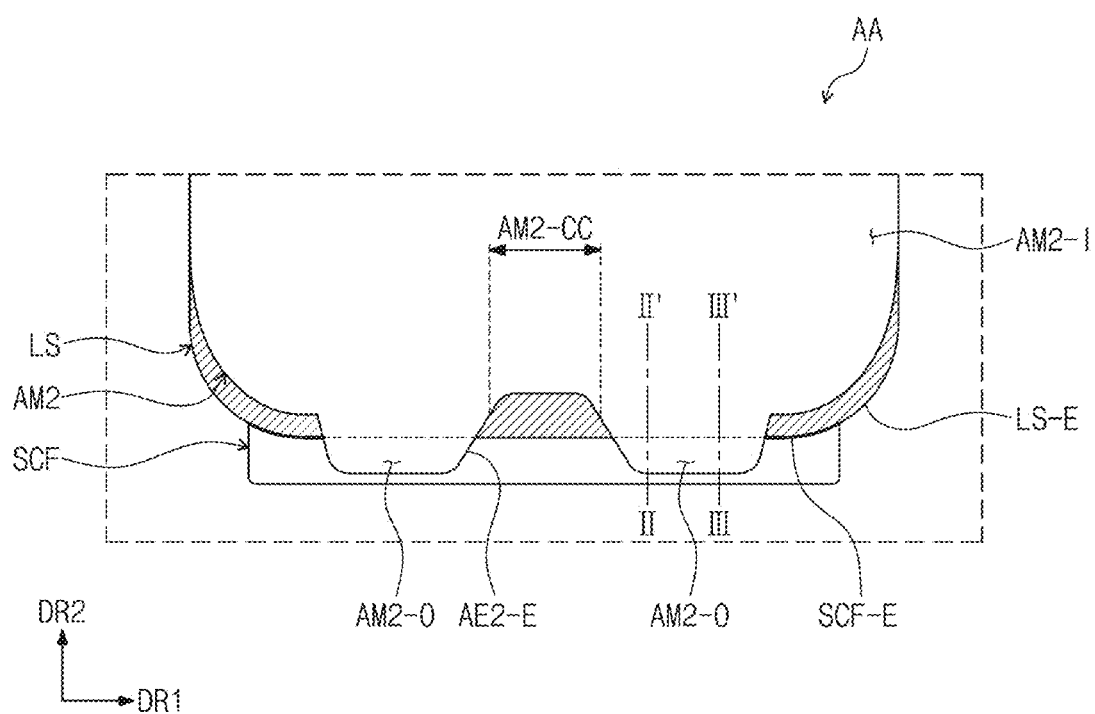
FIG. 6A is an enlarged plan view illustrating a portion of the display device according to an exemplary embodiment of the inventive concepts.
Figure 6B:
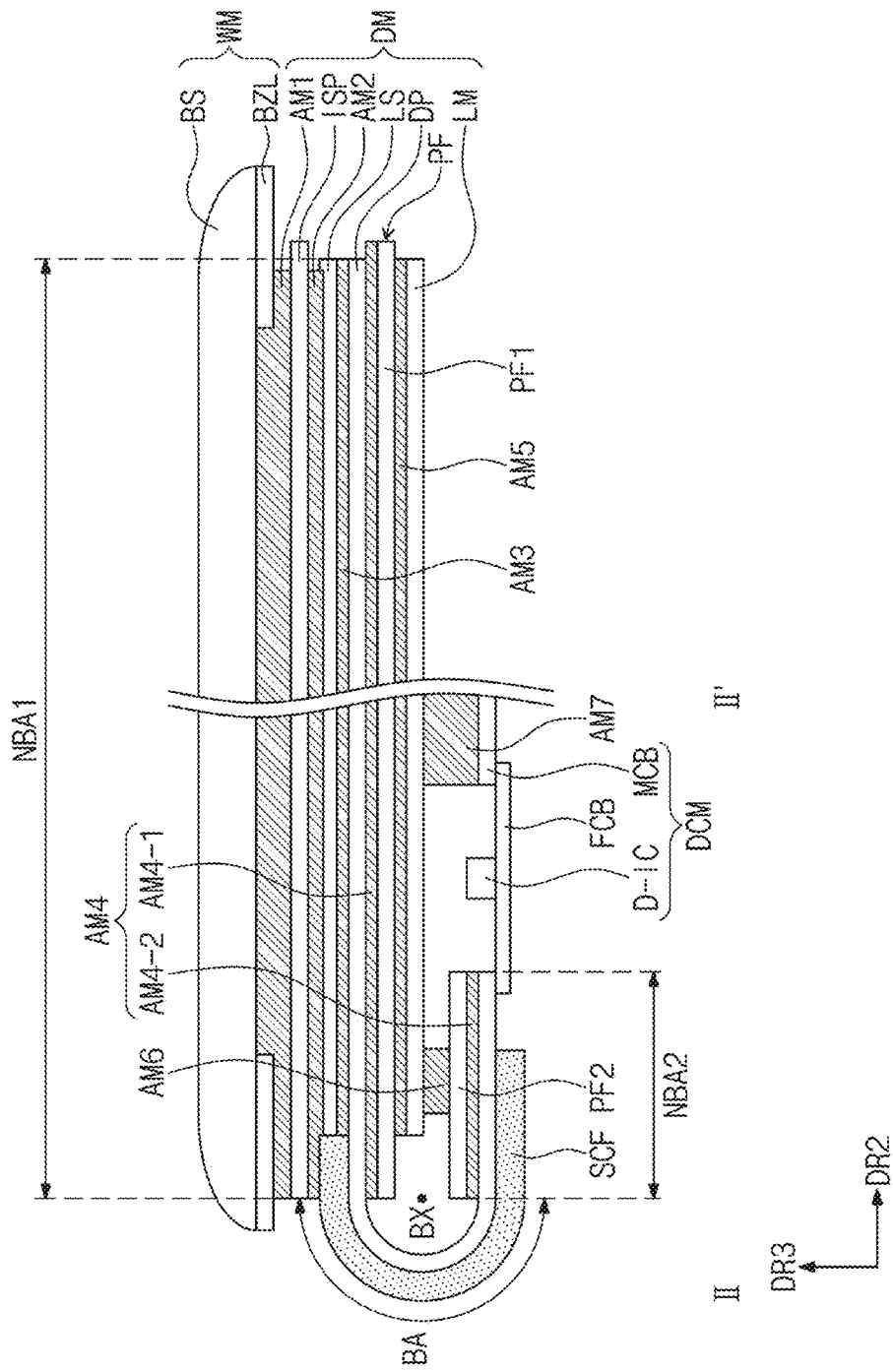
FIGS. 6B and 6C are cross-sectional views illustrating the display device according to an exemplary embodiment of the inventive concepts.
Figure 6C:
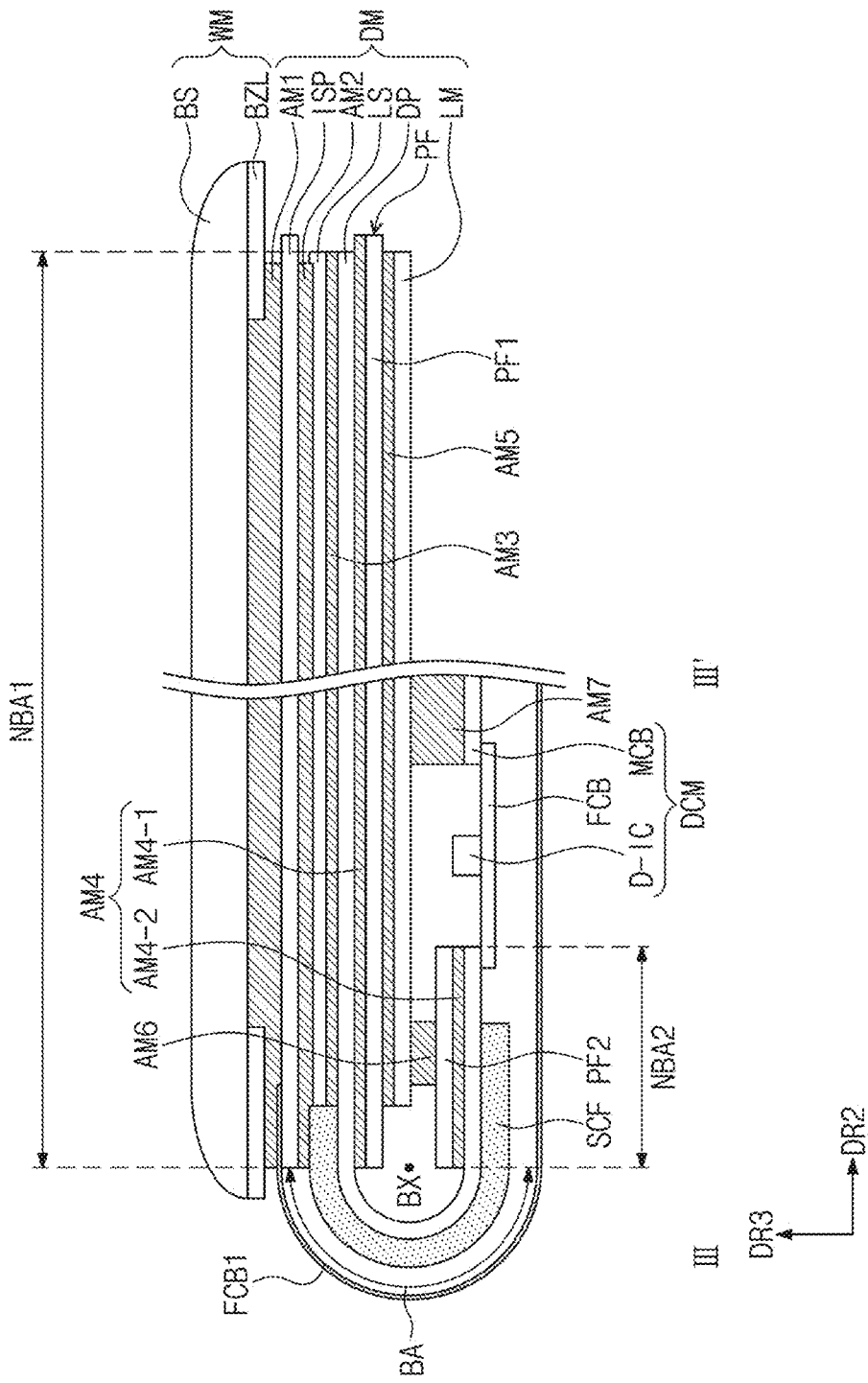

FIG. 6A is an enlarged plan view illustrating a portion of the display device DD according to an exemplary embodiment of the inventive concepts. FIGS. 6B and 6C are cross-sectional views illustrating the display device DD according to an exemplary embodiment of the inventive concepts. FIG. 6A corresponds to FIG. 4B, and FIGS. 6B and 6C correspond to FIGS. 4E and 4F, respectively.

In the exemplary embodiment, the outer portion may include one area. In the outer portion AM2-O, each of an area overlapping the connection area of the first connection circuit board FCB1 and an area non-overlapping the same has a substantially constant width in the second direction DR2. As an attachment area between the outer portion AM2-O and the stress control film SCF increases, a shear stress generated in the end of the stress control film SCF may decrease.

As described above, the delamination phenomenon occurring in the area of the stress control film, which overlaps the first non-bending area may be prevented or reduced. This is because the coupling force between the first adhesive member and the stress control film cancels out the stress generated by the bending phenomenon of the stress control film.

As the recessed area is defined in the first adhesive member, the lifting phenomenon of the first adhesive member may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a window;
an input sensing panel disposed on a bottom surface of the window;
a first connection circuit board connected to a top surface of the input sensing panel;
a second connection circuit board connected to a bottom surface of the input sensing panel;
an optical sheet disposed below the input sensing panel;
a display panel disposed below the optical sheet, the display panel comprising a first non-bending area overlapping the optical sheet, a bending area that is bent from the first non-bending area, and a second non-bending area that extends from the bending area and faces the first non-bending area;
a stress control film coupled to a top surface of the display panel, the stress control film overlapping the bending area, a partial area of the first non-bending area extending from the bending area, and a partial area of the second non-bending area extending from the bending area; and
a first adhesive member bonding the optical sheet to the input sensing panel,
wherein, on a plane, the first adhesive member comprises:
an inner portion overlapping the optical sheet; and
an outer portion extending from the inner portion toward an outside to non-overlap the optical sheet, and overlapping the stress control film, and
a first portion of an edge of the first adhesive member defines a recessed area, which is recessed toward a center area of the inner portion, so that a partial area of the optical sheet is exposed.

2. The display device of claim 1, wherein the second connection circuit board overlaps the recessed area.

3. The display device of claim 1, wherein the first connection circuit board overlaps the outer portion.

4. The display device of claim 3, wherein the outer portion comprises a first area and a second area, which have different surface areas from each other, and
the first connection circuit board overlaps the second area and non-overlaps the first area, and the second area has a surface area greater than that of the first area.

5. The display device of claim 1, wherein a second portion of the edge of the first adhesive member corresponds to the outer portion,
the outer portion comprises a first area, in which a distance from the inner portion to the second portion of the edge of the first adhesive member is a first distance, and a second area, in which a distance from the inner portion to the second portion of the edge of the first adhesive member is a second distance that is greater than the first distance, and
the second connection circuit board overlaps the second area.

6. The display device of claim 1, further comprising a third connection circuit board connected to the top surface of the input sensing panel,
wherein the second connection circuit board is disposed between the first connection circuit board and the third connection circuit board on the plane.

7. The display device of claim 6, wherein the outer portion comprises a first outer portion corresponding to the first connection circuit board and a second outer portion corresponding to the third connection circuit board.

8. The display device of claim 6, wherein the input sensing panel comprises:
a base layer;
first electrodes disposed on a top surface of the base layer;
first signal lines disposed on the top surface of the base layer and connected to one group of the first electrodes;
second signal lines disposed on the top surface of the base layer and connected to another group of the first electrodes;
second electrodes disposed on a bottom surface of the base layer and crossing the first electrodes; and
third signal lines disposed on the bottom surface of the base layer and connected to the second electrodes, and
the first connection circuit board is electrically connected to the first signal lines, the second connection circuit board is electrically connected to the third signal lines, and the third connection circuit board is electrically connected to the second signal lines.

9. The display device of claim 6, further comprising a second adhesive member bonding the window to the input sensing panel,
wherein the second adhesive member overlaps each of the first connection circuit board and the third connection circuit board on the plane.

10. The display device of claim 1, further comprising:
a first protection film disposed on a bottom surface of the display panel and overlapping the first non-bending area; and
a second protection film disposed on the bottom surface of the display panel and spaced apart from the first protection film and overlapping the second non-bending area.

11. The display device of claim 10, further comprising:
a metal plate disposed on a bottom surface of the first protection film; and
a second adhesive member bonding the metal plate to the second protection film.

12. The display device of claim 10, further comprising:
a pressure detecting sensor disposed on a bottom of the first protection film; and
a second adhesive member bonding the pressure detecting sensor to the second protection film.

13. The display device of claim 1, wherein the display panel comprises:
a base layer disposed in correspondence to the first non-bending area, the bending area, and the second non-bending area;
a circuit layer disposed on a top surface of the base layer and corresponding to the first non-bending area, the bending area, and the second non-bending area;
a display element layer disposed on a top surface of the circuit layer and overlapping the first non-bending area; and
an encapsulation layer disposed on the display element layer.

14. The display device of claim 1, wherein the optical sheet comprises at least one of a polarizer and a retarder.

15. The display device of claim 1, wherein the second non-bending area has a width less than that of the first non-bending area in a direction parallel to a bending axis.

16. The display device of claim 1, further comprising:
a first circuit board connected to the second non-bending area; and
a second circuit board connected to the first circuit board.

17. The display device of claim 16, wherein the first connection circuit board and the second connection circuit board are connected to the second circuit board.

18. A display device comprising:
a window;
an input sensing panel disposed on a bottom surface of the window;
a first connection circuit board connected to a top surface of the input sensing panel;
a second connection circuit board connected to a bottom surface of the input sensing panel;
an optical sheet disposed below the input sensing panel;
a display panel disposed below the optical sheet, the display panel comprising a first non-bending area overlapping the optical sheet, a bending area that is bent from the first non-bending area, and a second non-bending area that extends from the bending area and faces the first non-bending area;
a stress control film comprising an edge facing an edge of the optical sheet, the stress control film overlapping at least the bending area and coupled to a top surface of the display panel; and
an adhesive member bonding the optical sheet to the input sensing panel,
wherein, on a plane, the adhesive member comprises:
an inner portion overlapping the optical sheet; and
an outer portion extending from the inner portion toward an outside of the edge of the optical sheet and overlapping the stress control film, and
a portion of an edge of the adhesive member defines a recessed area, which is recessed toward a center area of the inner portion, so that a partial area of the optical sheet is exposed.

19. The display device of claim 18, wherein the first connection circuit board overlaps the outer portion, and
the second connection circuit board overlaps the recessed area.

20. A display device comprising:
a window;
an input sensing panel disposed on a bottom surface of the window;
an optical sheet disposed below the input sensing panel;
a display panel disposed below the optical sheet, the display panel comprising a first area overlapping the optical sheet, a second area that is bent from the first area, and a third area that extends from the second area and faces the first area;
a stress control film comprising an edge facing an edge of the optical sheet, the stress control film overlapping at least the second area and coupled to a top surface of the display panel; and
an adhesive member overlapping the stress control film and bonding the optical sheet to the input sensing panel,
wherein, on a plane, the adhesive member comprises:
an inner portion contacting the optical sheet; and
an outer portion extending from the inner portion to the outside of the edge of the optical sheet and attached to the stress control film.

* * * * *